(12) United States Patent
Reid

(10) Patent No.: US 7,057,246 B2
(45) Date of Patent: Jun. 6, 2006

(54) TRANSITION METAL DIELECTRIC ALLOY MATERIALS FOR MEMS

(75) Inventor: Jason S. Reid, Los Gatos, CA (US)

(73) Assignee: Reflectivity, INC, Sunnyvale, CA (US)

( * ) Notice: Subject to any disclaimer, the term of this patent is extended or adjusted under 35 U.S.C. 154(b) by 135 days.

(21) Appl. No.: 09/910,537

(22) Filed: Jul. 20, 2001

(65) Prior Publication Data

US 2002/0047172 A1     Apr. 25, 2002

Related U.S. Application Data

(60) Provisional application No. 60/228,007, filed on Aug. 23, 2000, provisional application No. 60/300,533, filed on Jun. 23, 2001.

(51) Int. Cl.
*H01L 29/82*   (2006.01)

(52) U.S. Cl. .................. 257/417; 257/254; 438/52

(58) Field of Classification Search .................. 438/52, 438/53, 455, 459, 619, 951; 257/415, 295, 257/296, 306, 310, 417, 419, 254
See application file for complete search history.

(56) References Cited

U.S. PATENT DOCUMENTS

| | | | |
|---|---|---|---|
| 4,904,543 A | 2/1990 | Sakakima et al. | |
| 5,262,000 A | 11/1993 | Welbourne et al. | |
| 5,439,754 A | 8/1995 | Iwasaki et al. | |
| 5,441,597 A | 8/1995 | Bonne et al. | |
| 5,444,173 A * | 8/1995 | Oyama et al. | 585/671 |
| 5,581,436 A | 12/1996 | Summerfelt et al. | |
| 5,612,574 A | 3/1997 | Summerfelt et al. | |
| 5,619,393 A | 4/1997 | Summerfelt et al. | |
| 5,622,893 A | 4/1997 | Summerfelt et al. | |

(Continued)

FOREIGN PATENT DOCUMENTS

EP     1102329 A2     5/2001

OTHER PUBLICATIONS

Linder et al., "Ternary Ta-Si-N Films for Sensors and Actuators", Sens. Actuators A, Phys. (Switzerland), vol. A61 No. 1-3 (1997), pp. 387-391.

(Continued)

*Primary Examiner*—Amir Zarabian
*Assistant Examiner*—Khanh Duong
(74) *Attorney, Agent, or Firm*—Gregory R. Muir

(57) ABSTRACT

Micromechanical devices are provided that are capable of movement due to a flexible portion. The micromechanical device can have a flexible portion formed of a nitride of preferably an element from groups 3A to 6A of the periodic table (preferably from the first two rows of these groups) and a late transition metal (preferably from groups 8B or 1B of the periodic table). The micromechanical devices can be any device, particularly MEMS sensors or actuators preferably having a flexible portion such as an accelerometer, DC relay or RF switch, optical cross connect or optical switch, or a micromirror part of an array for direct view and projection displays. The flexible portion is preferably formed by sputtering a target having a group 8B or 1B element and a group 3A to 6A element. The target can have other major constituents or impurities (e.g. additional group 3A to 6A element(s)). The target is reactively sputtered in a nitrogen ambient so as to result in a sputtered hinge. It is possible to form both stiff and/or flexible portions of the micromechanical device in this way.

35 Claims, 20 Drawing Sheets

U.S. PATENT DOCUMENTS

| | | | |
|---|---|---|---|
| 5,656,101 A | 8/1997 | Hayakawa et al. | |
| 5,665,628 A | 9/1997 | Summerfelt | |
| 5,679,980 A | 10/1997 | Summerfelt | |
| 5,696,018 A | 12/1997 | Summerfelt et al. | |
| 5,696,619 A | 12/1997 | Knipe et al. | |
| 5,729,054 A | 3/1998 | Summerfelt et al. | |
| 5,729,074 A * | 3/1998 | Shiomi et al. | 310/309 |
| 5,793,057 A | 8/1998 | Summerfelt | |
| 5,942,054 A | 8/1999 | Tregilgas et al. | |
| 5,994,750 A * | 11/1999 | Yagi | 257/415 |
| 6,020,215 A * | 2/2000 | Yagi et al. | 438/52 |
| 6,024,801 A | 2/2000 | Wallace et al. | |
| 6,090,697 A | 7/2000 | Xing et al. | |
| 6,124,650 A * | 9/2000 | Bishop et al. | 310/40 MM |
| 6,153,490 A | 11/2000 | Xing et al. | |
| 6,171,970 B1 | 1/2001 | Xing et al. | |
| 6,177,351 B1 | 1/2001 | Beratan et al. | |
| 6,190,802 B1 * | 2/2001 | Clerc et al. | 429/231.2 |
| 6,238,581 B1 | 5/2001 | Hawkins et al. | |
| 6,316,786 B1 | 11/2001 | Mueller et al. | |
| 6,395,168 B1 | 5/2002 | Acernese et al. | |
| 6,436,853 B1 | 8/2002 | Lin et al. | |
| 6,445,106 B1 | 9/2002 | Ma et al. | |
| 6,449,079 B1 * | 9/2002 | Herrmann | 359/214 |
| 6,479,920 B1 * | 11/2002 | Lal et al. | 310/309 |
| 6,522,801 B1 | 2/2003 | Aksyuk et al. | |
| 6,523,961 B1 | 2/2003 | Ilkov et al. | |
| 6,614,085 B1 * | 9/2003 | Hu | 257/437 |
| 2001/0008157 A1 | 7/2001 | Bishop et al. | |
| 2001/0040675 A1 | 11/2001 | True et al. | |

OTHER PUBLICATIONS

Nicolet et al., "Highly Metastable Amorphous or Near-Amorphous Ternary Films (Mictamict Alloys)", Microelectronic Engineering, vol. 55 (2001), pp. 357-367.

Nicolet, M., "Reactively Sputtered Ternary Films of the Type TM-Si-N and their Properties (TM = Early Transition Metal)", Vacuum, vol. 59 (2000), pp. 716-720.

Oizumi et al., "Control of Crystalline Structure and Electrical Properties of TaSiN Thin Film Formed by Reactive RF-Sputtering", Jpn. J. Appl. Phys., vol. 39 (2000), pp. 1291-1294.

Pinnow et al., "Decomposition and Nanocrystallization in Reactively Sputtered Amorphous Ta-Si-N Thin Films", J. Appl. Phys., vol. 90 No. 4 (Aug. 15, 2001), pp. 1986-1991.

Sun et al., "Reactively Sputtered Ti-Si-N Films I: Physical Properties", J. Appl. Phys., vol. 81 No. 2 (Jan. 15, 1997), pp. 656-663.

Sun et al., "Reactively Sputtered Ti-Si-N Films II: Diffusion Barriers for Al and Cu Metallizations on Si", J. Appl. Phys., vol. 81 No. 2 (Jan. 15, 1997), pp. 664-671.

Wong et al., "Barriers for Copper Interconnections", from the website of the Interconnect Focus Center at Stanford University (May 4, 1999).

Brizoual et al., "Experimental Study of Ti-Si-N Films Obtained by Radio Frequency Magnetron Sputtering", Surface and Coatings Technology 116-119 (1999), pp. 922-926.

Cherry et al., Stability of Conducting Amorphous Ru-Si-O Thin Films Under Oxygen Annealing, Microelectronic Engineering 55 (2001), pp. 403-408.

Dubois, P., "Electrostatically Actuated Gas Microvalve Based on a Ta-Si-N Membrane", from the website of The Sensors, Actuators and Microsystems Laboratory at University of Neuchâtel, Switzerland (publication date unknown; accessed and printed Jul. 2, 2001).

Eisenbraun et al., "Low Temperature Inorganic Chemical Vapor Deposition of Ti-Si-N Diffusion Barrier Liners for Gigascale Copper Interconnect Applications", J. Vac. Sci. Technol. B, vol. 18 No. 4 (Jul./Aug. 2000).

Gasser et al., "Reactively Sputtered Ru-Si-O Films", Journal of Applied Physics, vol. 86, No. 4 (Aug. 15, 1999).

Gretillat et al., "Surface-Micromachined Ta-Si-N Beams for Use in Micromechanics", J. Micromech. Microeng., vol. 8 (1998), pp. 88-90.

Hauert et al., "From Alloying to Nanocomposites—Improved Performance of Hard Coatings", Advanced Engineering Materials, vol. 2 No. 5 (2000), pp. 247-259.

He et al., "Letter to the Editor: Bonding Structure and Properties of Ion Enhanced Reactive Magnetron Sputtered Silicon Carbonitride Films", J. Phys.: Condens. Matter, vol. 12 (2000), pp. L591-597.

Herdt et al., "PVD Copper Barrier/Seed Processes: Some Considerations for the 0.15 μm Generation and Beyond", Semiconductor Fabtech, 11th Edition (1999), pp. 259-264.

Kim et al., "Nanostructured Ta-Si-N Diffusion Barriers for Cu Metallization", J. Appl. Phys., vol. 82 No. 10 (Nov. 15, 1997), pp. 4847-4851.

Lee et al., "Characterization of Tantalum Nitride Films Deposited by Reactive Sputtering of Ta in N2/Ar Gas Mixtures", Materials Chemistry and Physics, vol. 68 (2001), pp. 266-271.

Maex, K. et al, Ed, Properties of Metal Silicides, pp. 97-102, Published by Inspec, London, England, 1992.

Rogl, P, et al, Phase Diagrams of Ternary Boron Nitride and Silicon Nitride Systems, pp. 1-2, 6-7, 18-19, 32-37, 76-78, 85-87, 97-100, 103-106, 113-120, 125-130, 133-134, 144-157, 169-171, 175-177, 180-186, 195-199, 205-209, 215-218' Published by ASM International, Materials Park, Ohio, 1992.

* cited by examiner

Co-Si-N Isothermal Section at 1000°C    isothermal section 1273 K

In the absence of external nitrogen pressure.

Ni-Si-N Isothermal Section at 900°C    isothermal section 1173 K

In the absence of external nitrogen pressure.

Ru-Si-N Isothermal Section at 1000°C isothermal section 1273 K

In the absence of external nitrogen pressure.

Ag-Si-N Isothermal Section at 900°C

TRANSITION METAL DIELECTRIC ALLOY MATERIALS FOR MEMS

This application is related to and claims benefit under 35 USC § 119 of U.S. provisional applications 60/228,007 to Reid filed Aug. 23, 2000, and 60/300,533 to Reid filed Jun. 23, 2001, the subject matter of each being incorporated herein by reference.

BACKGROUND

Field of the Invention

Summary of the Invention

In the present invention, MEMS devices (micro electromechanical systems, micro optoelectromechanical systems, micromechanical systems, etc.) are provided that are capable of movement due to a flexible portion formed of a transition metal-silicon (or boron or aluminum) nitride. The MEMS devices can be any device, such as accelerometers, DC relay and RF switches, optical cross connects and optical switches, microlenses, reflectors and beam splitters, filters, oscillators and antenna system components, variable capacitors and inductors, switched banks of filters, resonant combdrives and resonant beams, and micromirror arrays for direct view and projection displays. The flexible portion (e.g. the hinge of the mirror in the MEMS example herein) is preferably formed by sputtering a metal target in nitrogen ambient so as to result in a sputtered transition metal nitride hinge. It is also possible to form other parts of the MEMS device (e.g structural parts that do not flex) out of the transition metal nitride.

In one embodiment of the invention, the MEMS material is a ternary (or higher) material X-Y-Z, where X is a transition metal—preferably a late transition metal; Y is Si, Al or B; and Z is N (or O—N). The material can comprise a nitride (or oxynitride or carbonitride) that forms an insulating matrix (e.g. silicon nitride, oxynitride or carbonitride), with small "bubbles" or particles of e.g. a late transition metal interspersed throughout the matrix. Or, depending upon the relative amounts of the ceramic and transition metal, the material can comprise a transition metal matrix with small "bubbles" or particles of a silicon (or boron or aluminum) nitride. In the one embodiment, the late transition metal is a noble metal or ferromagnetic metal. In a preferred embodiment, the MEMS material is amorphous and conductive.

DETAILED DESCRIPTION

Figure 1A:
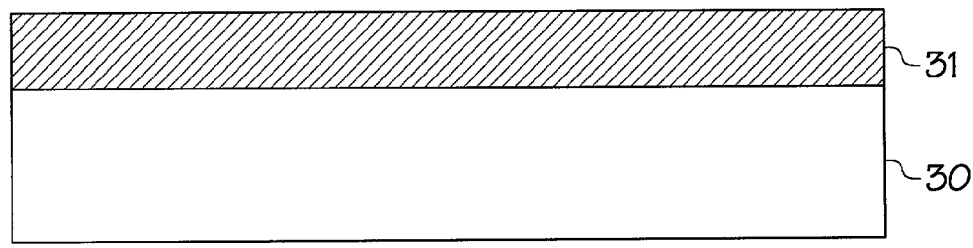
FIGS. 1A to 1J are cross sectional views of one method of making a MEMS device in accordance with the present invention.

Micromechanical Structure Fabrication:

Methods (e.g. thin film deposition methods) and materials (e.g. various nitrides such as conductive nitrides and/or ternary or higher nitrides) related to the present invention are disclosed in U.S. Pat. No. 5,916,634 to Fleming et al., U.S. Pat. No. 6,017,818 to Lu, U.S. Pat. No. 6,177,351 to Beratan et al., U.S. Pat. Nos. 6,090,697, 6,153,490, and 6,171,970 each to Xing et al., and U.S. Pat. Nos. 5,612,574, 5,581,436, 5,622,893, 5,619,393, 5,665,628, 5,679,980, 5,696,018, 5,729,054, and 5,793,057 each to Summerfelt et al., and EP1102329 to Matsushita et al., each of these patents or published applications being incorporated herein by reference. Some of the materials of the present invention are known, such as for copper diffusion barriers—however, as will be discussed below, such materials have not been used for MEMS devices, in particular for hinges or other flexible portions of MEMS devices.

A wide variety of MEMS devices can be made in accordance with the present invention, sensors (e.g. pressure sensors and accelerometers); movable elements in microfluidics such as microvalves, micropumps and micronozzles; micromirrors for optical scanning, microscopy, spectroscopy, maskless lithography, projection displays and optical switching; MEMS switches such as DC relays and RF MEMS switches; variable capacitors, variable inductors and variable optical attenuators; phased array antennas and other military MEMS applications, microfabricated resonators, gyroscopes, microturbines, etc. The examples below are micromirrors, however any of these or other MEMS devices can be made in accordance with the methods and materials of the present invention.

In a preferred embodiment of the present invention, a multiphase composite is provided. The multiphase composite is made up of a rigid matrix material, preferably a ceramic, that alone would be stiff, but somewhat brittle, and in which is a softer material that alone could plastically deform, but could not sustain high loads. Together, however, the right combination of stiffness and plasticity is achieved. Within the matrix material is the softer metallic material that is preferably in elemental rather than compound form. The rigid matrix material is preferably a binary compound Y-Z where Y is selected from groups 3A to 6A of the periodic table (e.g. Al, B and/or Si), and Z is N. In this way, the matrix material is preferably a nitride of silicon, aluminum or boron. As used herein, "nitride" includes oxynitrides and carbonitrides, though preferably the additional oxygen or carbon is present in an amount of 10 atomic % or less. Within the matrix material is interspersed the softer metallic "particles" that preferably comprise a transition metal (preferably from groups 8B or 1B of the periodic table) that is preferably not bound to nitrogen. If the MEMS material is deposited by sputtering and the target is predominantly a transition metal, then the material can be a matrix of a transition metal (e.g. late transition metal) with particles of a nitride of e.g. Al, B or Si.

Minimizing nitrides of the transition metal is preferred, though not required. This can be accomplished by selecting a transition metal that does not readily form nitrides, or that forms metastable nitrides—and/or by annealing at a temperature that causes transition metal nitrides to release the bound nitrogen. In the present application, the late transition metals are those transition metals in columns headed by Fe, Co, Ni, Cu or Zn (preferred late transition metals being those in groups 8B and 1B, namely columns headed by Fe, Co, Ni or Cu), whereas the noble metals are defined in the present application as Ru, Rh, Pd, Ag, Os, Ir, Pt or Au, and the ferromagnetic transition metals are Fe, Co or Ni. Though the MEMS device of the present invention (or at least the flexible portions thereof) need not be conductive, in a preferred embodiment, the portions of the device made of the nitride materials are conductive. If it is desired for the material of the MEMS device to be conductive, the conductivity is preferably 10,000 $\mu\Omega$ cm or less, more preferably 3000 $\mu\Omega$ cm or less, and most preferably 1000 (or even 500) $\mu\Omega$ cm or less.

In one embodiment of the invention, a nitrogen atmosphere is used in a reactive sputtering apparatus, where the amount of nitrogen in the atmosphere is from 10 to 90% (also preferably where the deposited film has from 10 to 60 at % N). Also, in one embodiment, the sputtering target has from 15 to 85% late transition metal with the remainder being one or more elements from groups 3A to 6A as mentioned above. More than one late transition metal could be in the target, though one is preferred. Also, the atmosphere could be an oxygen atmosphere supplied by a source of compressed oxygen connected to the sputtering apparatus (or nitrogen and oxygen), though nitrogen is preferred. Also, it is preferred that the deposited film is viewed as being amorphous, though the film can be viewed as polycrystalline as well, depending upon the type and amount of the different elements in the target, the amount of nitrogen in the atmosphere during sputtering (if a sputtering process is used for deposition), the temperature of the deposition or whether or not the film is heated/annealed after formation, etc. Regardless of terminology, it is preferred that the film has a long range order of less than 250A, and more preferably less than 100A.

Figure 1B:
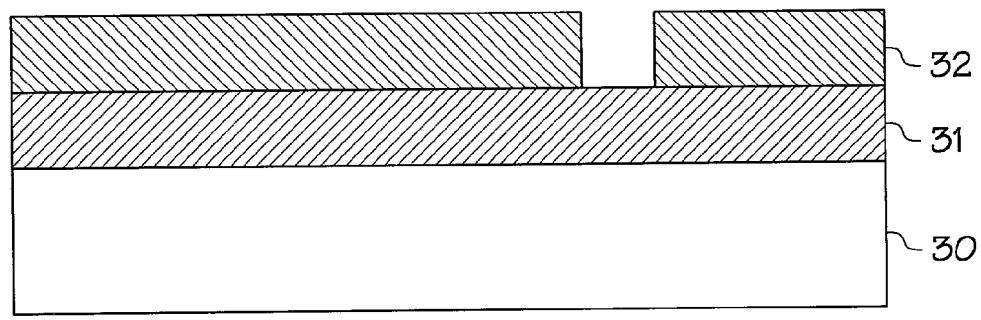
Figure 1C:
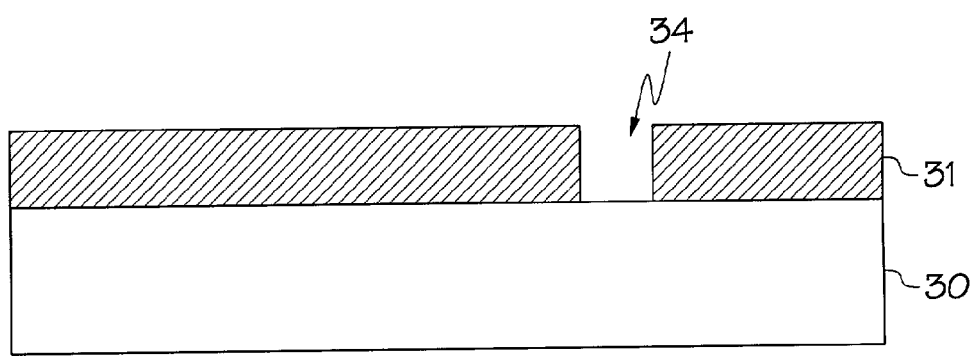
Figure 1D:
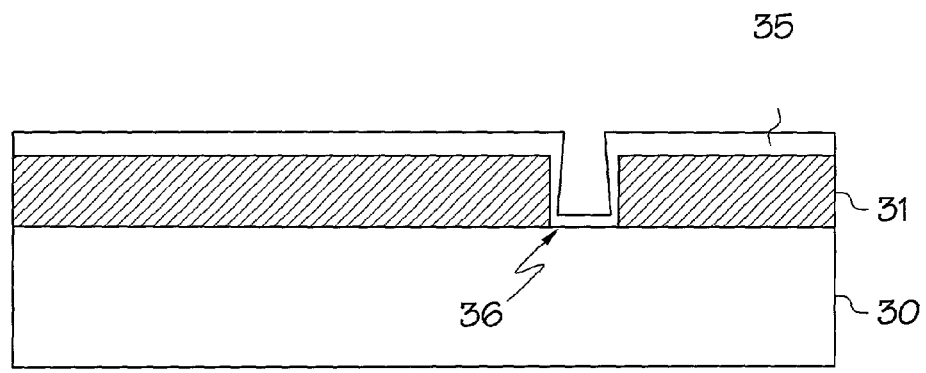

One example of a method for making the MEMS device of the present invention is illustrated in FIGS. 1A to 1J. As can be seen in FIG. 1A, a substrate 30 (this can be any suitable substrate, such as a glass/quartz substrate or a semiconductor circuit substrate) that has deposited thereon a sacrificial material 31. Any suitable sacrificial material can be used, preferably one that has a large etching selectivity ratio between the material being etched and the sacrificial material. One possible sacrificial material is an organic sacrificial material, such as photoresist, or other organic materials such as set forth in U.S. patent application 60/298, 529 filed Jun. 15, 2001 to Reid et al. Depending upon the exact make-up of the structural layer(s), other known MEMS sacrificial materials, such as amorphous silicon or PSG could be used. If the sacrificial material is not directly patternable, then a photoresist layer 32 is added and developed to form one or more apertures (FIG. 1B). Then, as can be seen in FIG. 1C, apertures 34 are etched into the sacrificial material 31 and the photoresist 32 is removed. As can be seen in FIG. 1D, a (preferably conductive) layer 35 is deposited that will ultimately form at least the flexible portions for the MEMS device (in this example a micromirror structure). Layer 35 can also form the posts 36 for attaching the micromirror to the substrate, or even all or part of the micromirror body. As will be discussed further herein, the conductive layer 35 in a preferred embodiment of the invention comprises a metal-Si,Al,B-nitride, preferably the metal is a transition metal, in particular a late transition metal. Layer 35 could also be a plurality of (preferably conductive) layers, or one conductive layer among many other types of layers (structural dielectric layers, reflective layers, anti-stiction layers, etc.). Layer 35 need not be conductive, and depending upon the exact method, target material and atmosphere used in the deposition process, layer 35 could also be insulating.

Figure 1E:
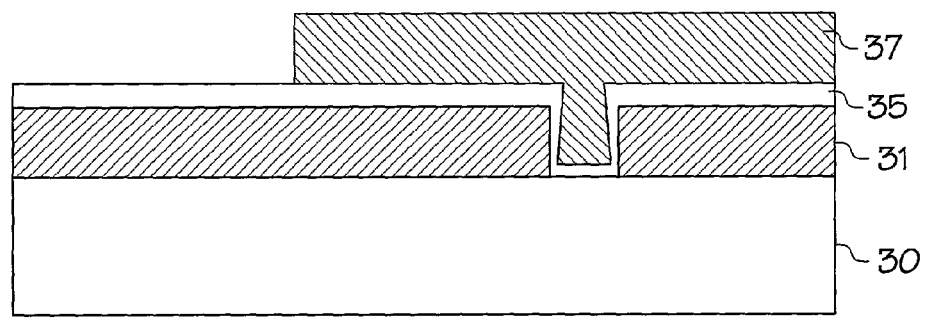
Figure 1F:
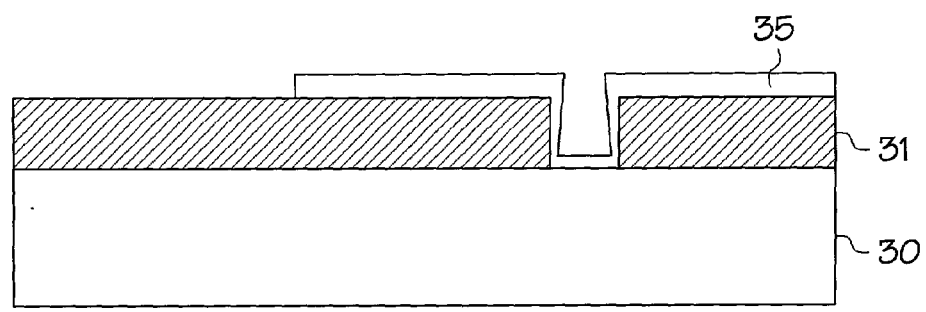
Figure 1G:
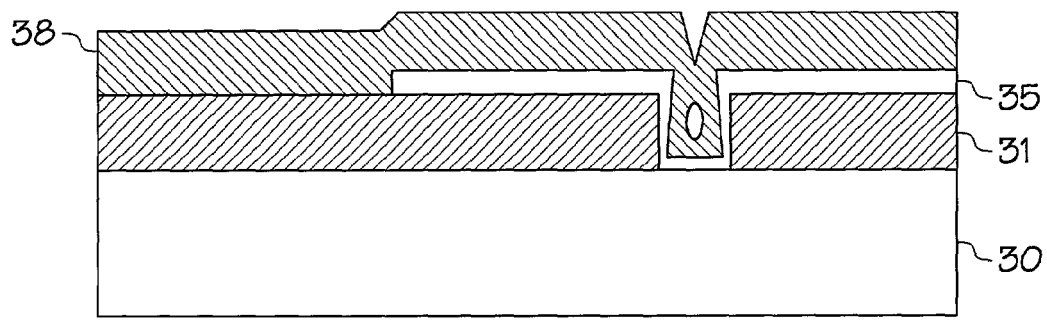
Figure 1H:
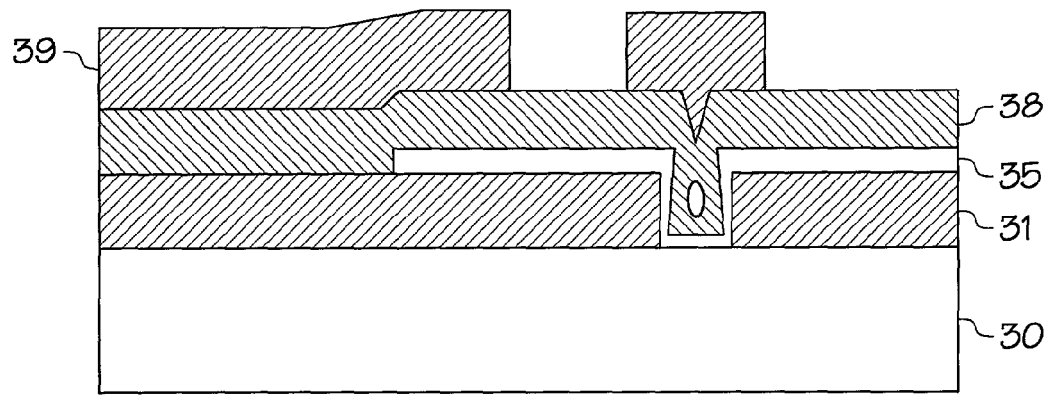
Figure 1I:
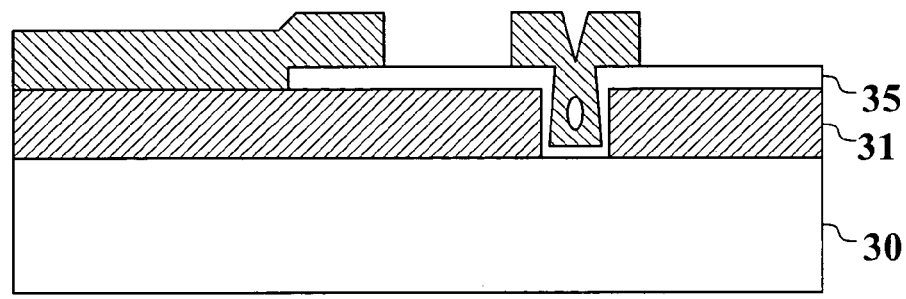
Figure 1J:
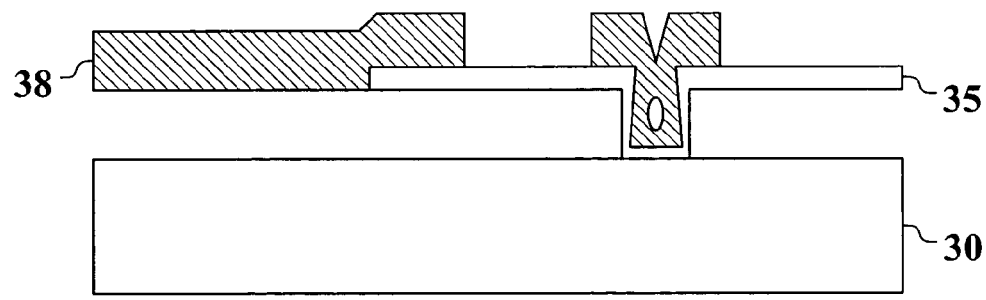

FIG. 1E shows the addition of photoresist 37 (patterned) followed by etching of a portion of the nitride layer(s) 35 and removal of the photoresist (FIG. 1F). Then, as can be seen in FIG. 1G, mirror structural material layer 38 is deposited. The material can be conductive or insulating and can be a plurality of layers. If the material is a single layer, it is preferably reflective (e.g., an aluminum or gold layer or metal alloy layer). Then, as can be seen in FIG. 1H, photoresist 39 is added and developed followed by (FIG. 1I) etching/removing portions of the layer 38 (such as in the area of the parts that will flex in operation). Finally, as can be seen in FIG. 1J, the sacrificial layer is removed to release the MEMS device so as to be free standing on the substrate. Not shown in FIG. 1 is circuitry that is formed on or in substrate 30 (if the substrate is a circuit substrate) or a light blocking layer on substrate 30 for improving automated handling of the substrate (if the substrate is a light transmissive substrate such as glass, quartz, sapphire, etc.).

As can be seen from FIGS. 1A to 1H, a free standing MEMS structure is created where layer 35 forms a flexible portion of the MEMS device, whereas layer 38 forms the structure that moves due to the flexible nature of layer 35. Layer 38, as can be seen, forms both the movable portion as well as the post or wall that holds the MEMS structure on the substrate 30. The movable element can be formed as a laminate of layers 38 and 35 (as well as additional layers if desired), or solely from layer 38, or even solely from layer 35. The make-up of the movable and flexible elements depend upon the ultimate stiffness or flexibility desired, the ultimate conductivity desired, the MEMS device being formed, etc.

As set forth in U.S. Pat. Nos. 5,835,256 and 6,046,840 to Huibers (incorporated herein by reference), if the substrate is light transmissive and the MEMS devices are mirrors, the light transmissive substrate can be bonded to a circuit substrate having electrodes thereon in order for the MEMS devices (micromirrors) to be addressable. Such a dual substrate approach could be for other MEMS devices such as micro-relays as set forth in EP1093143 to Bishop et al. published Apr. 18, 2001. However, the MEMS device could also be performed monolithically with the circuitry and micromechanical structures formed on the same substrate, such as set forth in U.S. Pat. No. 6,057,520 (high voltage MEMS switch on circuit substrate), U.S. Pat. No. 6,099,132 to Kaeriyama (micromirrors held on a circuit substrate), and U.S. Pat. No. 6,069,540 to Berenz et al. (RF switch formed monolithically with MMICs).

Figure 2A:
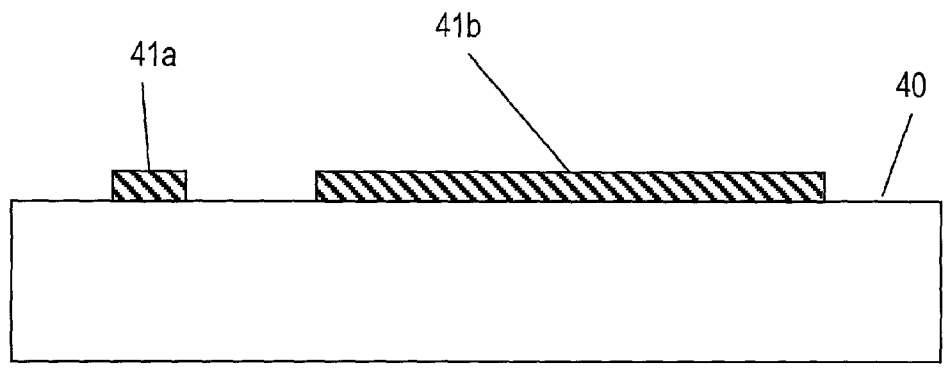
FIGS. 2A to 2G are cross sectional views of another method of making a MEMS device in accordance with the present invention.
Figure 2B:
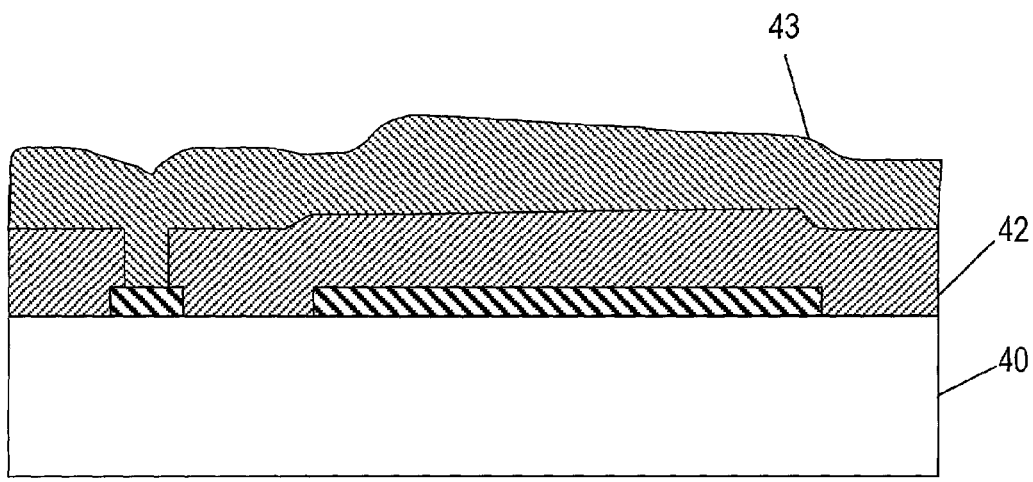
Figure 2C:
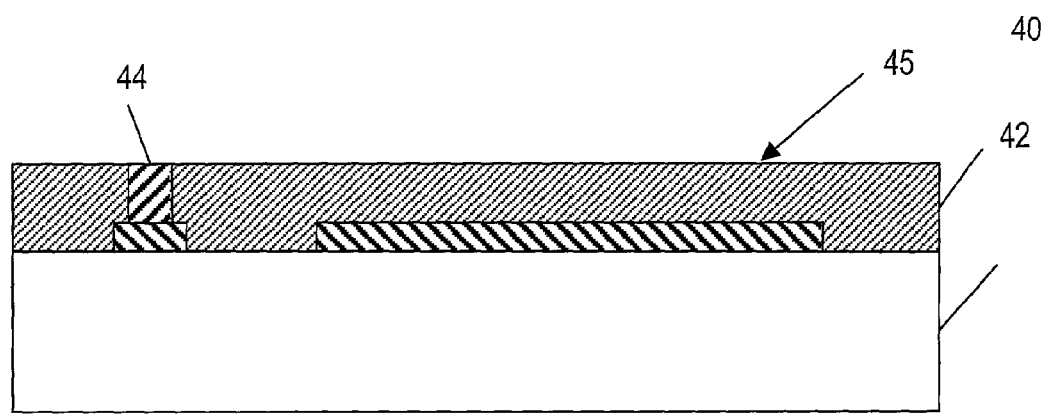

A MEMS device and process showing a circuit substrate and a pull-in electrode is illustrated in FIGS. 2A to 2G. As can be seen in FIG. 2A, a circuit (e.g CMOS) substrate 40 is provided having a patterned final metal layer 41a, 41b from the circuit process. Deposited thereon as can be seen in FIG. 2B, is a sacrificial layer 42, which can be any suitable sacrificial material as mentioned above. In the present example, the sacrificial material is amorphous silicon deposited by pressure enhanced chemical vapor deposition (PECVD) or sputtering (physical vapor deposition of PVD). The amorphous silicon can be annealed to increase stability and patterned to form apertures for MEMS structural material. Then, as can be further seen in FIG. 2B, a plug layer 43 (for example, a refractory metal such as W, Mo, Ti or Ta or a conductive metal compound) is deposited such as in a cold wall, low pressure CVD system, and preferably from a WF6 source (if the metal is W). This metal deposition is followed by chemical mechanical polishing (CMP) to form a plug 44 and a sacrificial layer 42 having a smooth surface 45.

Figure 2D:
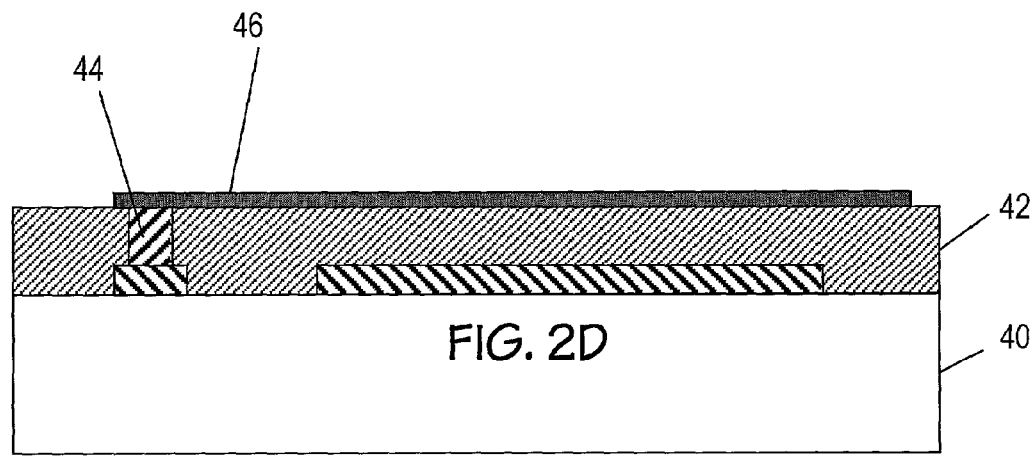
Figure 2E:
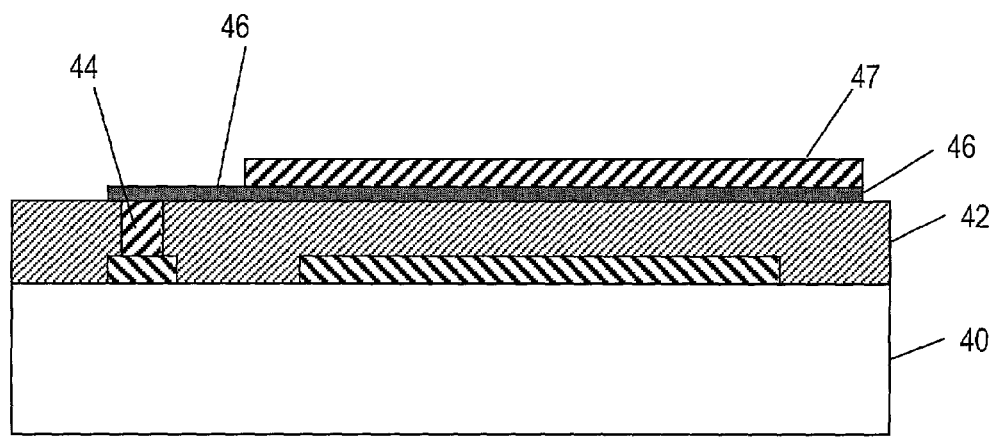
Figure 2F:
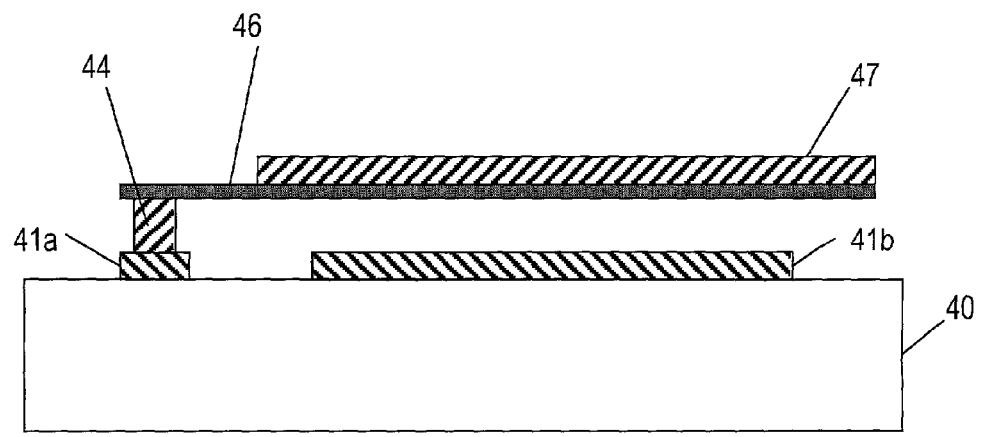
Figure 2G:
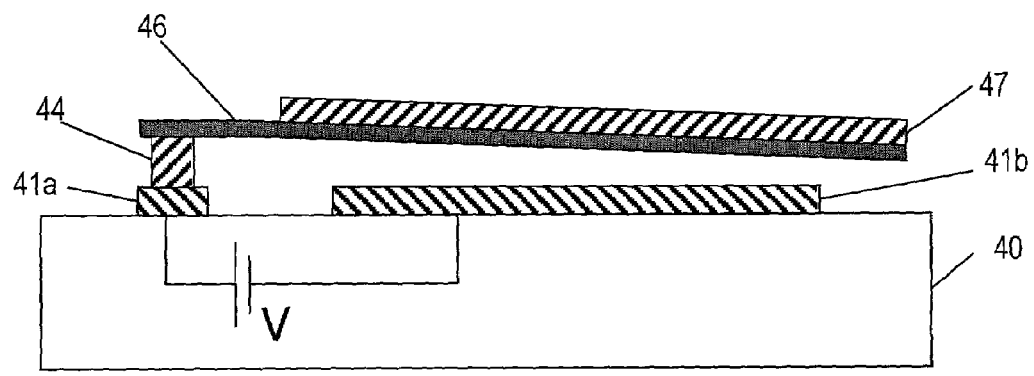

As can be seen in FIG. 2D, once the sacrificial layer 42 and plug 44 are planarized, layer 46 is deposited—preferably by sputtering. Layer 46 preferably comprises a metal-silicon (or Al or B) nitride, as will be discussed further below and is patterned to form the desired MEMS structural shape. In this example, layer 46 comprises a metal-silicon- (or aluminum or boron) nitride, where the metal is preferably a late transition metal. After depositing layer 46, the layer can be annealed to change the stress characteristics of the layer, followed by patterning. Next, depending upon the type of MEMS device being formed, as can be seen in FIG. 2E, an additional structural layer 47 is added. This additional layer provides stiffness to the device, yet does not fully cover layer 46 after being patterned. The additional layer 47 can be reflective if the MEMS device being made is a micromirror. This structural arrangement allows the uncovered portion of layer 46 to flex from one position (FIG. 2F) to a deflected position (FIG. 2G) after removal of the sacrificial layer (e.g. with xenon difluoride if the sacrificial layer is amorphous silicon). In this way, at least a portion of the MEMS device is made of the nitride material of the present invention—where in the example of FIG. 2, both a structural and a flexible portion are made of the nitride material. Of course the patterning of the layers in FIG. 2 can be performed as part of the process of FIG. 1 and vice versa. The nitride material of the present invention can also be provided as multiple layers in addition to a reflective layer (if the MEMS device is a micromirror array), such as set forth in U.S. patent application 60/300,533. Also, alternating layers (e.g. nanolayers) of transition metal and nitride material could be deposited rather than as a combined matrix as set forth elsewhere herein. Multilevel structures can be provided by repeating the steps shown in FIGS. 2B through 2D. In essence, all process steps and structures can be altered, omitted or added to, as long as at least part of the MEMS device formed is of the material of the invention as set forth herein.

In one embodiment of the invention, the MEMS material is a ternary (or higher) material X-Y-Z, where X is a transition metal—preferably a late transition metal; Y is Si, Al or B; and Z is N (or O—N or C—N). Thus the material is viewed as comprising a nitride (or oxynitride or carbonitride) that forms an insulating matrix (e.g. silicon nitride, oxynitride or carbonitride), with small "bubbles" or particles of e.g. a late transition metal (in this application, a metal from columns 8B, 1B or 2B of the periodic table) interspersed throughout the matrix. In one embodiment, the late transition metal is a noble metal (for the present application this means Ru, Rh, Pd, Ag, Os, Ir, Pt or Au). In another embodiment, the late transition metal is Co, Ni or Fe). In a preferred embodiment, the MEMS material is amorphous and conductive.

The flexibility of forming a number of different MEMS structure materials is in part due to sputtering a target in a nitrogen atomosphere. Though sputtering is not required to deposit a transition metal nitride on a substrate (various chemical vapor deposition—CVD—processes for example are known), in the present invention, sputtering (otherwise referred to as physical vapor deposition or PVD) is preferred. The target preferably comprises a transition metal and P, Si, Al or B (preferably Si or B). When the target is sputtered in an atmosphere of nitrogen and argon, for example (preferably at least nitrogen (for chemically bonding to one or more components of the target upon release) and a relatively neutral gas for providing the physical aspect of the sputtering). The target and/or atmosphere could comprise oxygen and/or carbon so as to cause the formation of oxynitrides or carbonitrides—the amount of oxygen or carbon in the MEMS structural material will depend upon the amount of oxygen or carbon in the target and/or sputtering atmosphere. In a preferred embodiment, the target comprises silicon and a late transition metal and the atmosphere comprises nitrogen and argon. The target can be a compound of a transition metal and aluminum, silicon or boron, the target could be separate unbound particles of each element, or even a multi-target arrangement could be used.

The preferred sputtering method is reactive sputtering. The target of transition metal and one or more elements from groups 3A to 6A of the periodic table—preferably from the first two rows of these groups such as Si, Al or B, is sputtered in a glow discharge containing a gas mixture of Ar and N2. The nitride compounds are formed when sputtered group 3A to 6A atoms adsorb on the wafer surface and then react with the N gas atoms that hit the wafer surface. The plasma in the reactive sputtering apparatus provides sufficient energy to dissociate the N2 molecules into atomic nitrogen, which then reacts with the silicon to form silicon nitride. Reactive sputtering apparatus for performing this method are known in the art. Though other deposition methods could be used, sputtering is preferred because of the flexibility it allows in the choice of materials. Simply altering the composition of the sputtering target (e.g. one or more elements from groups 8B or 1B, and one or more elements from groups 3A to 6A) sputtered in an atmosphere of nitrogen and or oxygen, allows for a very large number of materials to be deposited. Though some materials will have better stress, elasticity and conductivity than other materials deposited in this way, a very large number of materials combinations for MEMS devices can be formed by sputtering in accordance with the present invention. A few of the many examples of ternary (or higher) systems are illustrated in FIG. 4.

Figure 3:
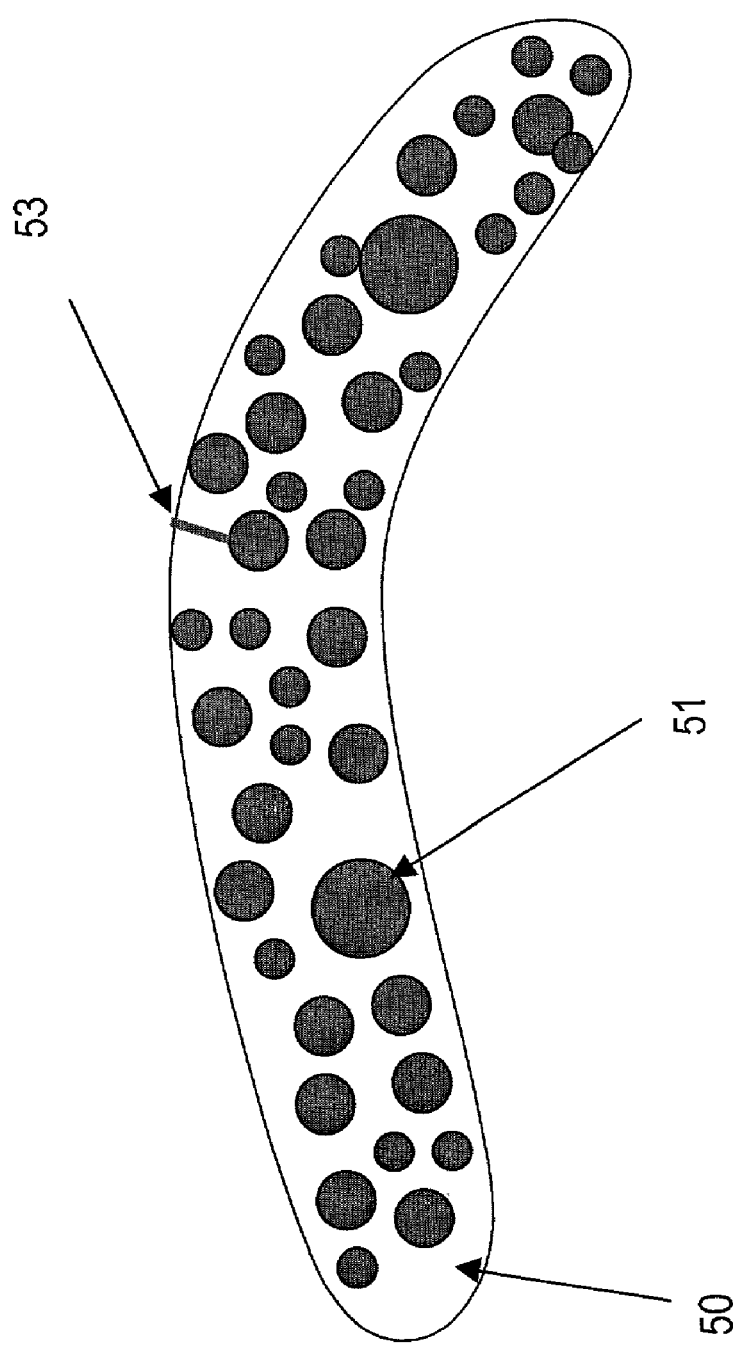
FIG. 3 is a representation of one example of the MEMS material of the present invention.
Figure 4A:
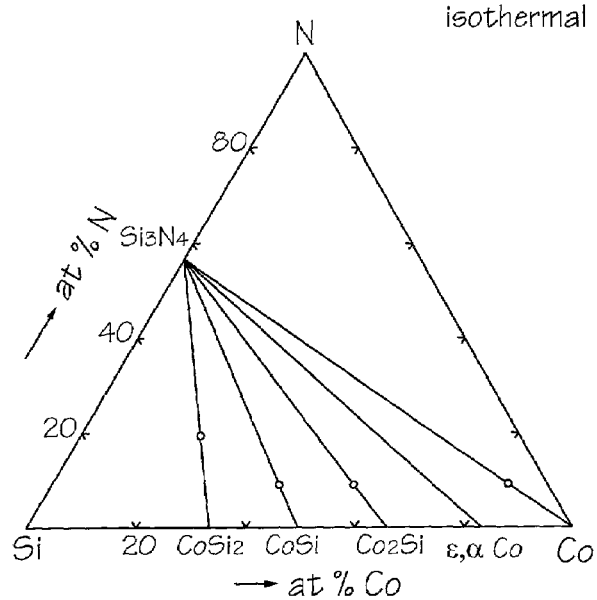
FIGS. 4A to 4L are ternary phase diagrams for various examples of the MEMS material of the present invention.
Figure 4B:
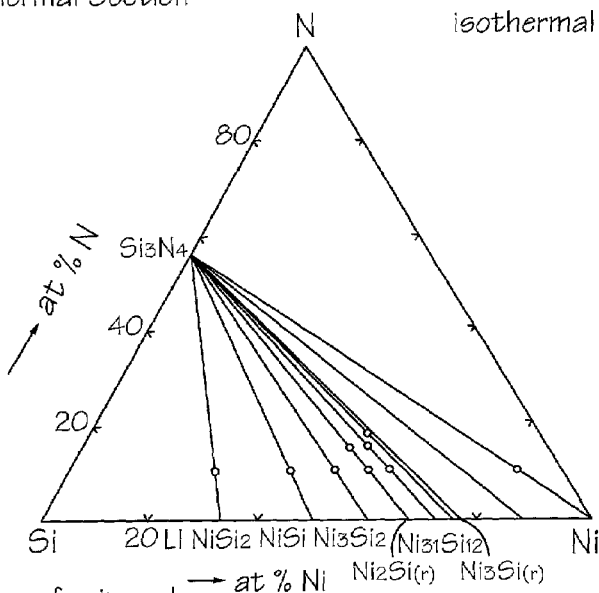
Figure 4C:
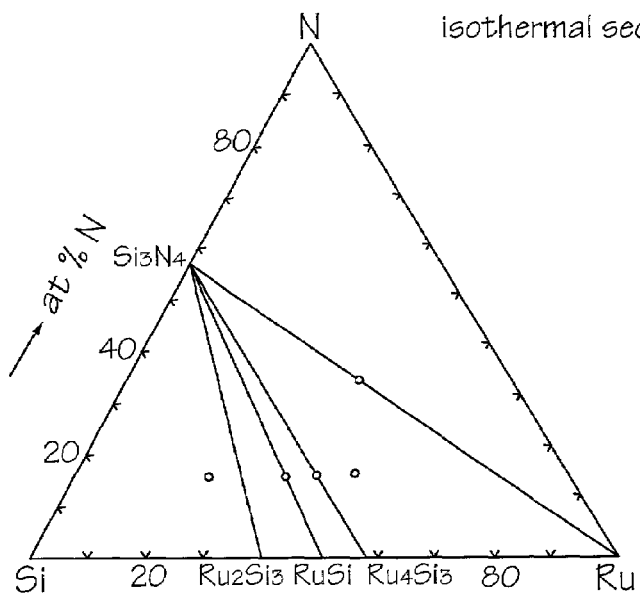
Figure 4D:
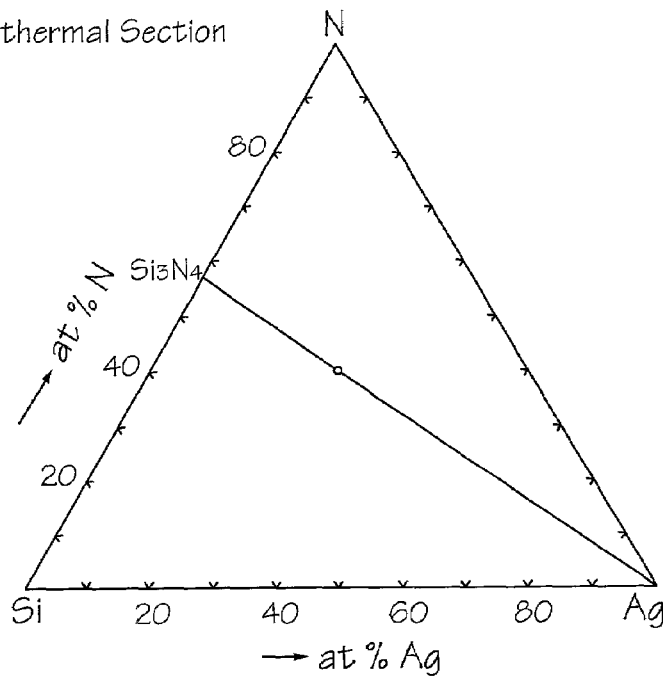
Figure 4E:
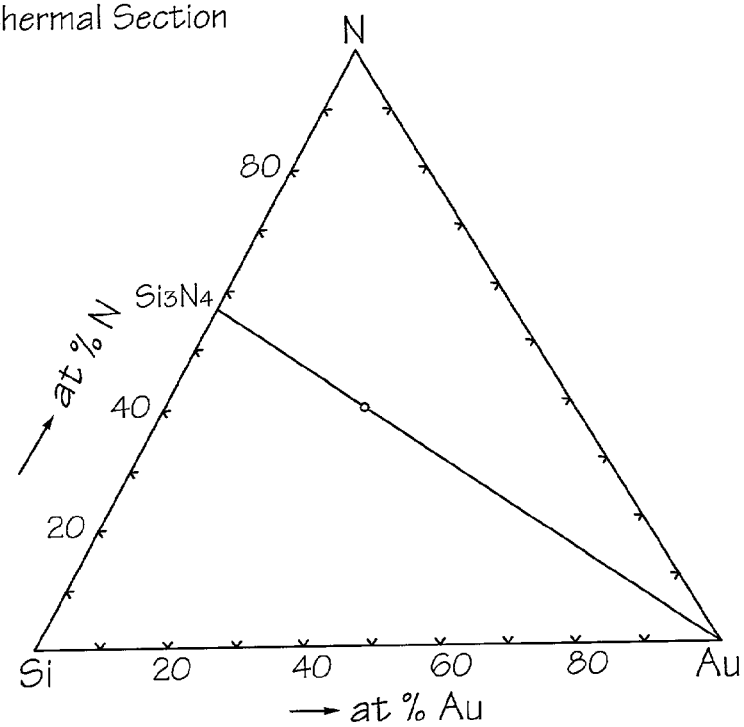
Figure 4F:
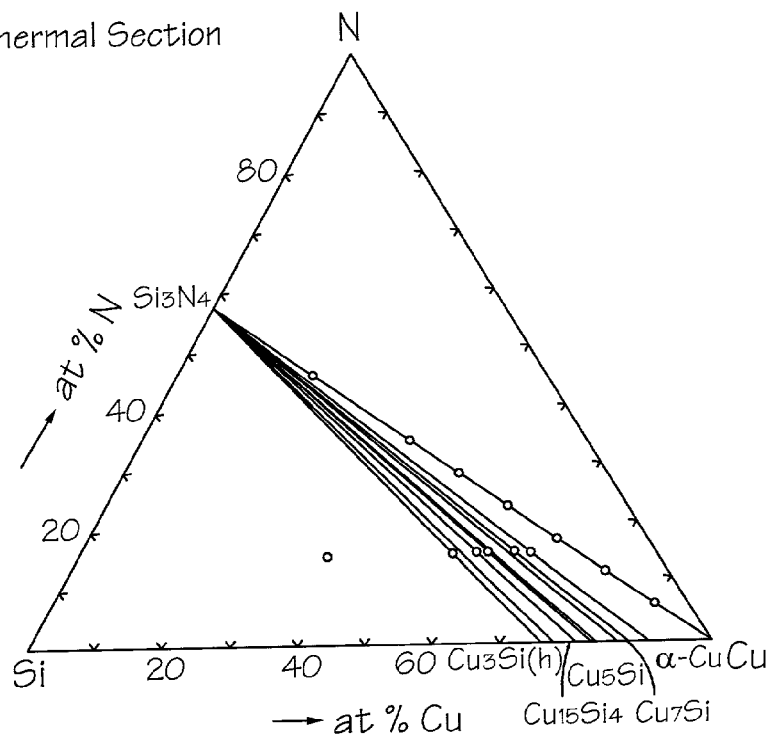
Figure 4G:
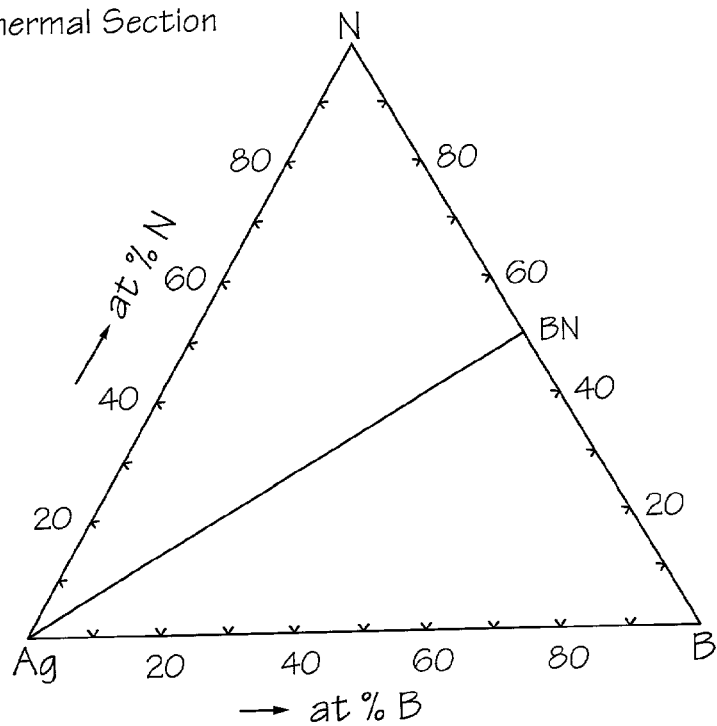
Figure 4H:
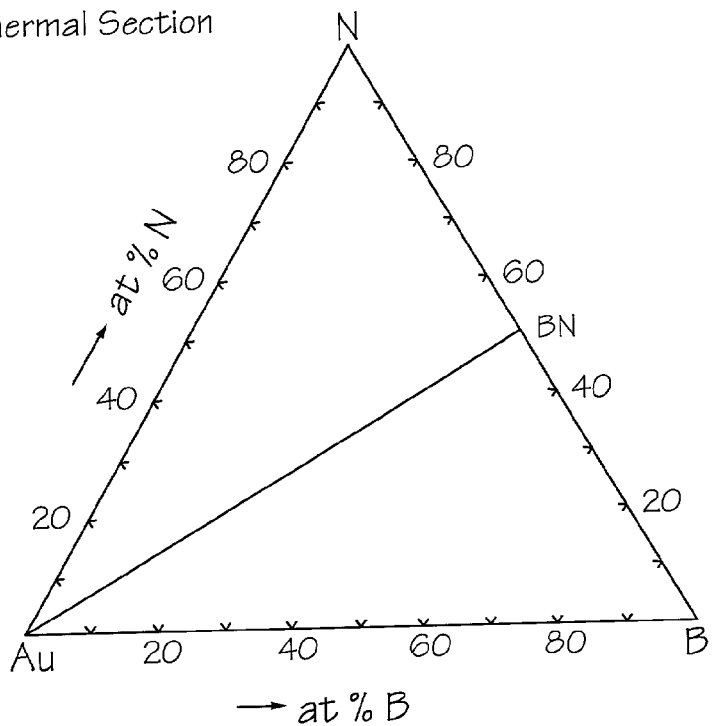
Figure 4I:
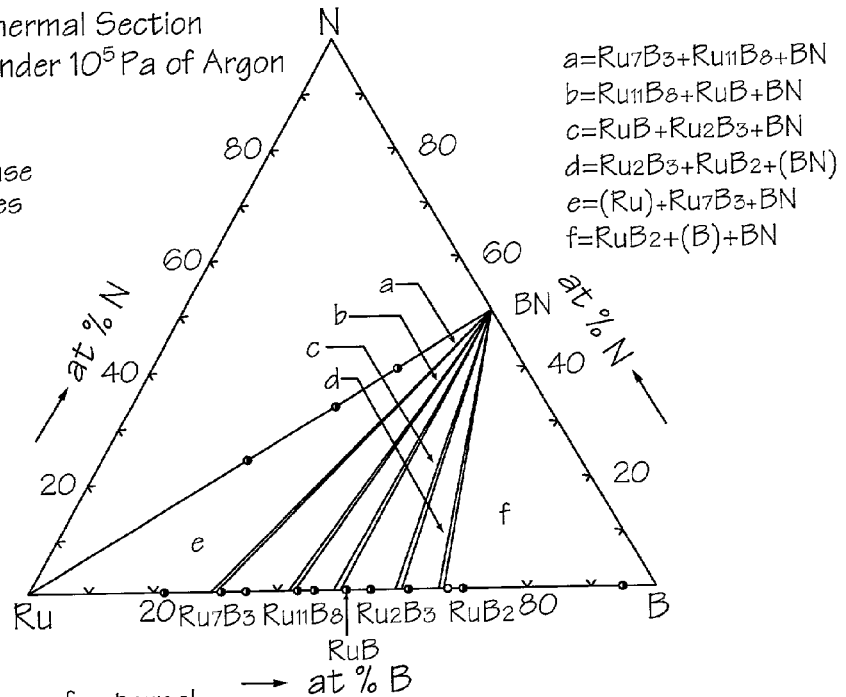
Figure 4J:
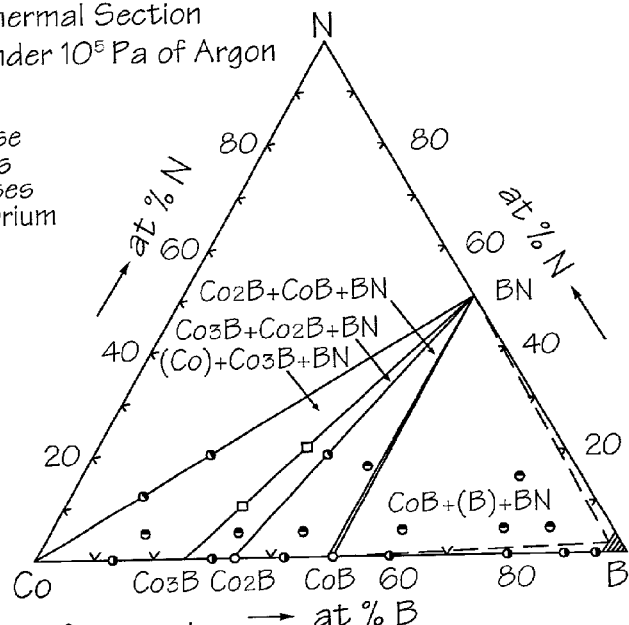
Figure 4K:
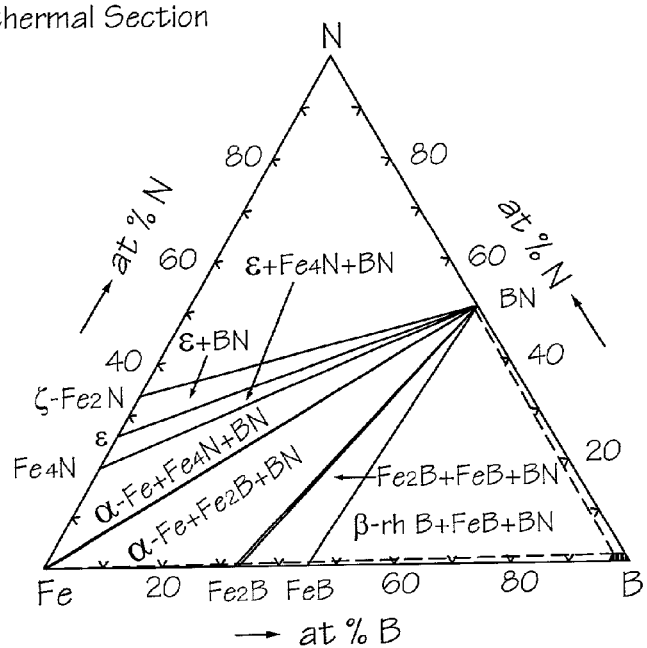
Figure 4L:
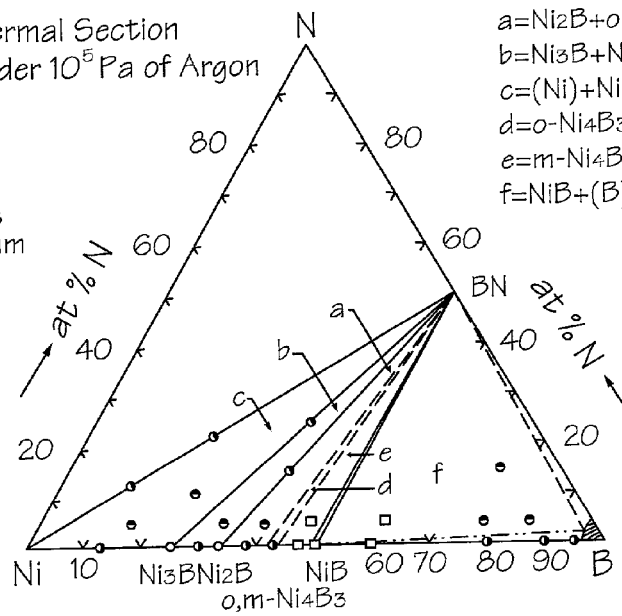

Because the nitrogen preferentially bonds with silicon vs. bonding with the late transition metal, unless there is an excess of nitrogen, a ceramic (in this example silicon nitride) matrix will form (50 in FIG. 3) with interspersed softer metal particles 51 (in this example a late transition metal such as Ni, Co, Fe, Pd, Ag, Pt or Au). When substantially or fully saturated with nitrogen, the deposited material is a multi-phase material as shown in FIG. 3. Such a multi-phase MEMS material can aid in preventing elongation of a microcrack 53, as the softer metal material 51 "absorbs" microcracks that might develop in the more brittle surrounding matrix. Of course, depending upon the amounts of the materials in the target, the softer material 51 and the more brittle material 50 can effectively trade places, where the softer material forms a matrix surrounding particles of the more brittle material.

Annealing the nitride MEMS structure may be desirable in some situations. For example, if it is desired to have a tensile stress film (or a zero stress film) the deposited film can be annealed (e.g. at 400 to 500 C.) to cause a compressive film to have lower stress, zero stress or even tensile stress. Annealing can also help to eliminate TM—N bonding. Though the late transition metal can be as a nitride compound after deposition, in a preferred embodiment the late transition metal is primarily in elemental (unbound to nitrogen) form. In one embodiment of the invention, the MEMS film is deposited to have compressive stress and relatively low resistivity, and is annealed to turn the stress tensile (preferably from 0 to 100 MPa).

As can be seen in FIGS. 4A to 4L, ternary phase diagrams are shown for various late transition metal silicon and boron nitrides. Picking FIG. 4A as an example (Co—Si—N), the phase diagram is for sputtering a cobalt silicide target in an argon/N2 discharge. Adjusting the amount of N2 in the sputtering atmosphere allows for optimizing the composition of the MEMS material near the Co—Si3N4 tie line. Cobalt is a desirable choice among the late transition metals as it is "fab safe" (used for salicide), has a low affinity for N in the Ar/N2 discharge (this allows for primarily an elemental transition metal to be interspersed within the ceramic matrix). However, the present invention is in no way limited by materials in common use in integrated circuit manufacturing. Transition metals and preferably late transition metals-particularly those in sections 8B and 1B of the periodic table (that is, those columns beginning with Fe, Co, Ni and Cu) can be used in the present invention, as these metals are less likely to form nitrides during the reactive sputtering process. Though early transition metals such as Ti, W, Ta, Re, V, Nb, Mo or Cr could be used (particularly W, Ti, Mo or Re), late transition metals such as the noble metals (Ru, Rh, Pd, Ag, Os, Ir, Pt or Au) or other late transition metals such as the ferromagnetic transition metals (Co, Ni, or Fe) are the preferred metals in the present invention. Also, the matrix could be SiOx (or BOx, POx, COx or AlOx, though SiOx is preferred) with late transition metals interspersed within the SiOx matrix (preferably noble metals)—though at lower oxygen concentrations, a metal silicide phase may exist as well. As with the metal silicon nitride MEMS structures, the noble metal silicon oxides offer superior mechanical performance over their commonly used binary counterparts (e.g. silicon dioxide), with brittle SiO2 providing stiffness and high tensile yield strength and the noble metal affording ductility and toughness. However, a SixNy matrix is preferred in the present invention.

Figure 5:
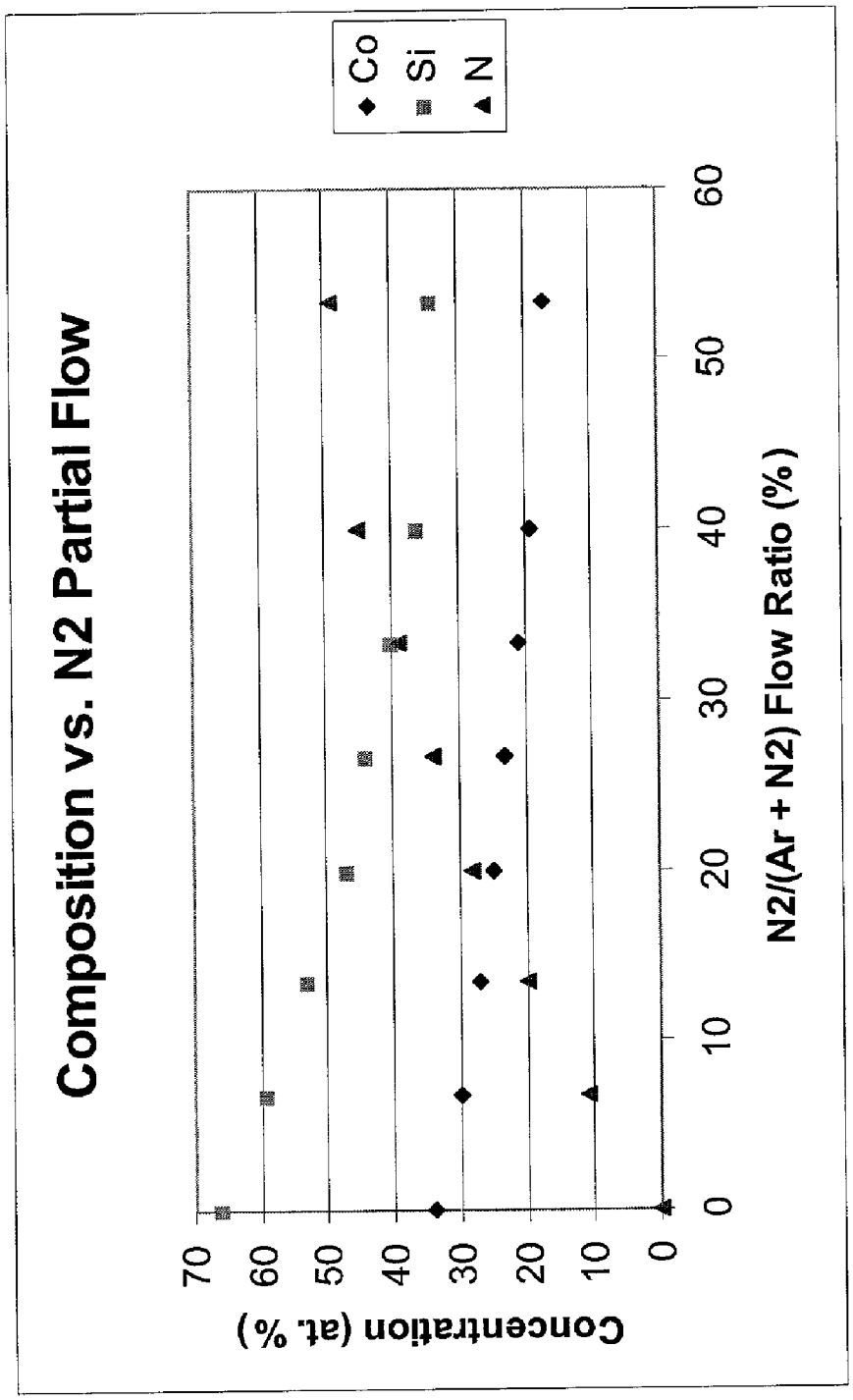
FIG. 5 is a graph of concentrations of each of three components for one example of the present invention.
Figure 6:
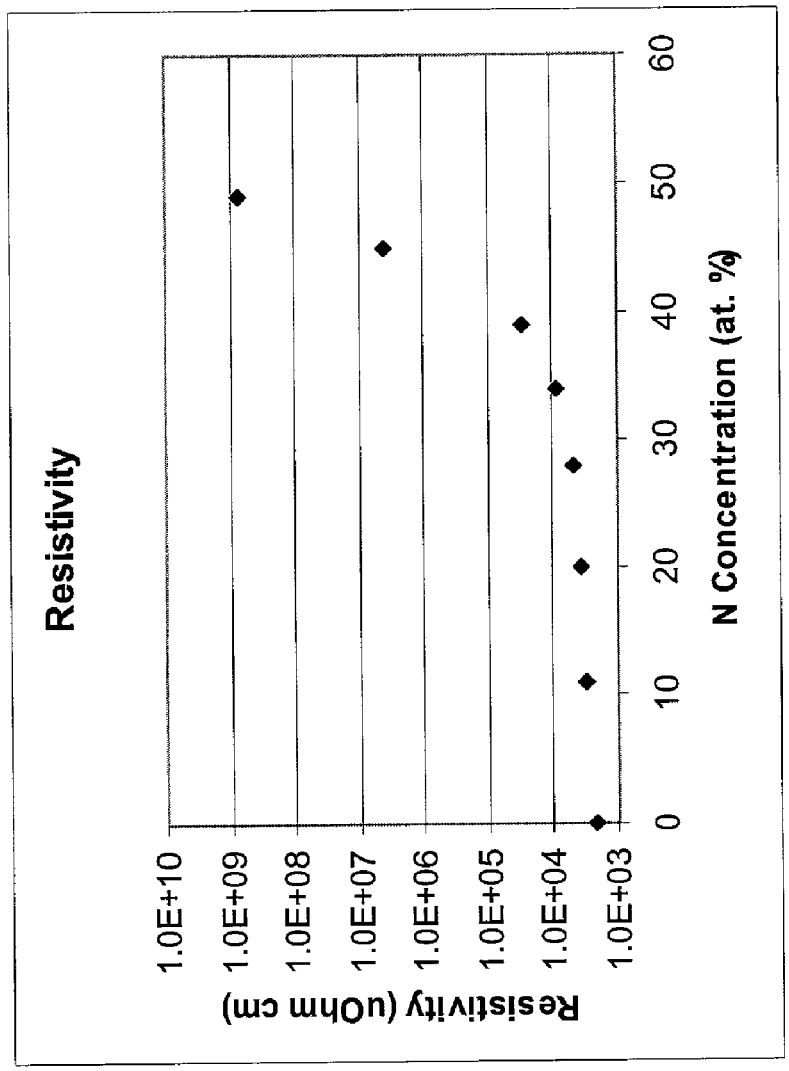
FIG. 6 is an graph of resistivity vs. nitrogen concentration.
Figure 7:
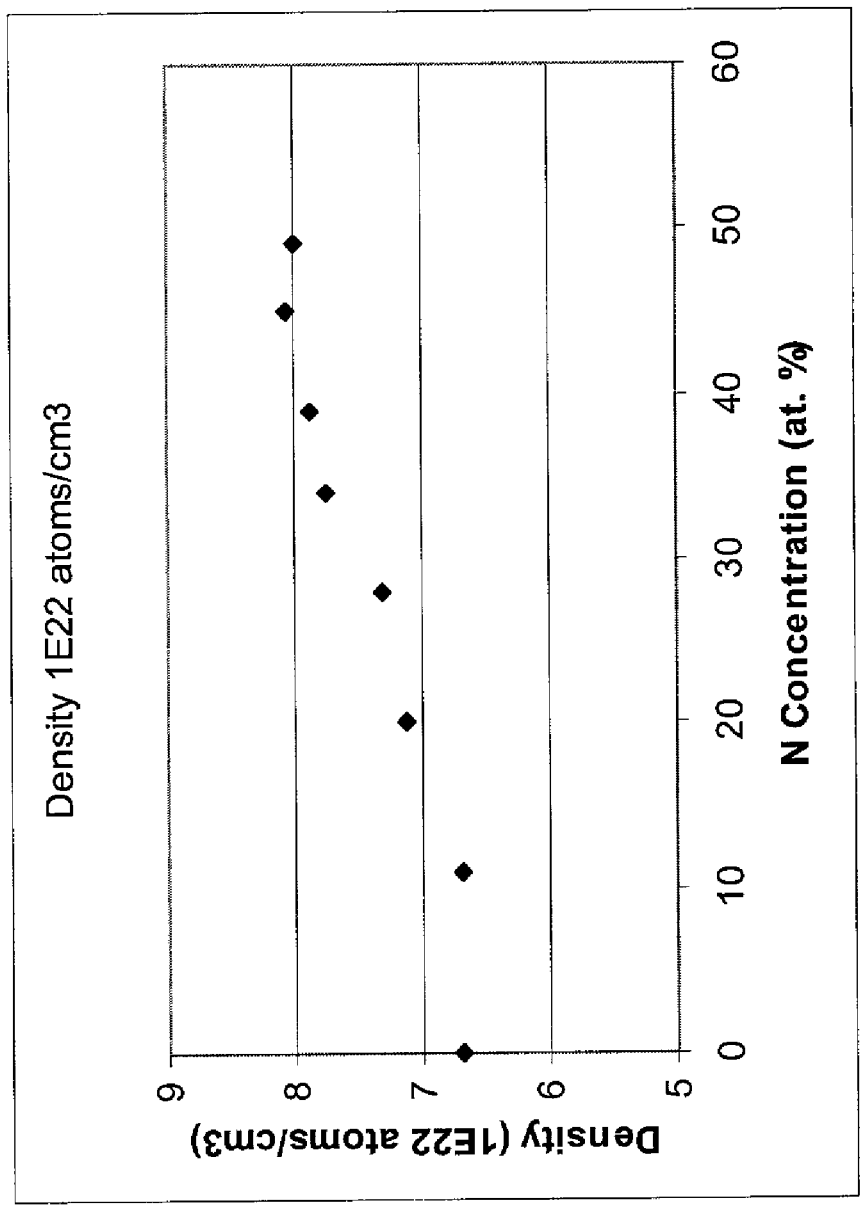
FIG. 7 is an graph of film density vs. nitrogen concentration.
Figure 8:
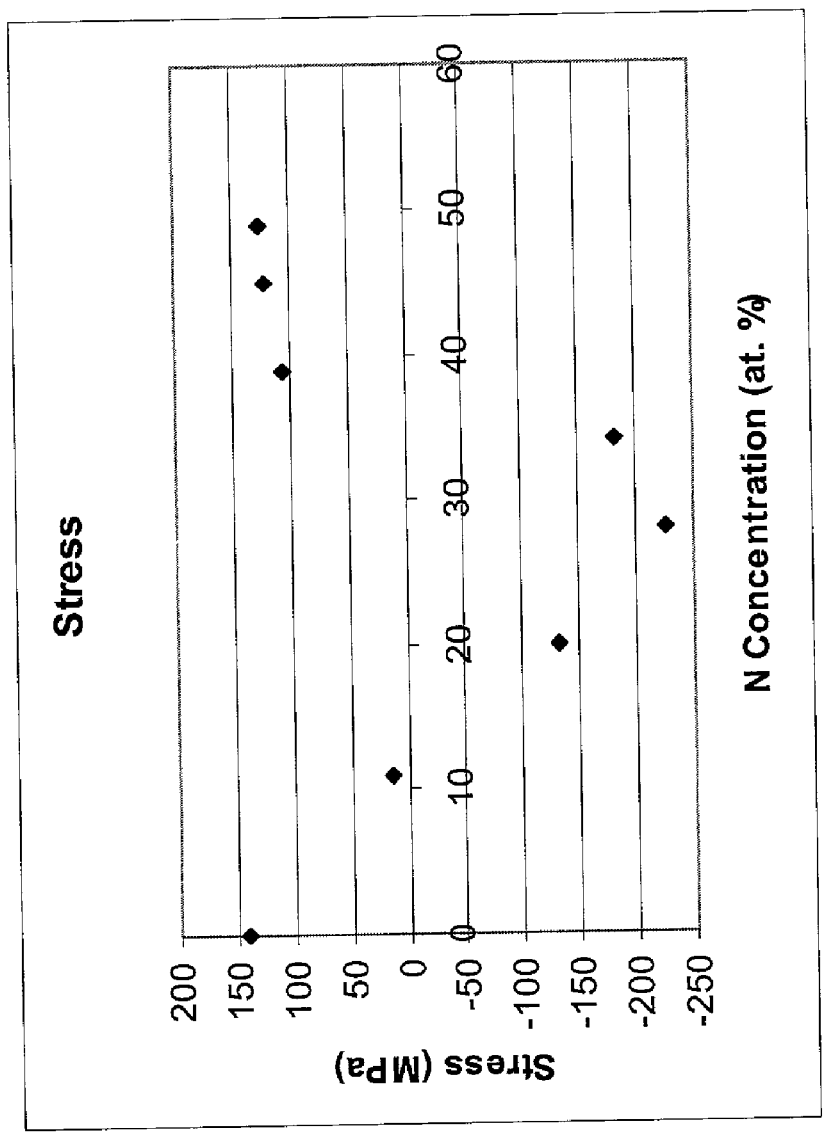
FIG. 8 is an graph of stress vs. nitrogen concentration.

FIG. 5 illustrates the composition of deposited Co—Si—N material at varying N2 partial flow rates in a UHV (ultra high vacuum) sputtering system. As can be seen in this figure, as the N2/(Ar+N2) flow ratio % is increased, the concentration (at %) of silicon and cobalt decrease whereas the amount of nitrogen (or nitride) in the deposited material increases. (oxygen 5 at. % for silicide, 10 at. % for nitrided films). FIG. 6 illustrates the increase in resistivity of the deposited MEMS film as the nitrogen concentration increases in the reactive sputtering process. The lowest resistivity is around 3000 µΩ cm because of a low level of oxygen in the cobalt silicide target. The oxygen allows for the formation of silicon oxynitride in the matrix that improves stress characteristics of the deposited film (less compressive) but increases the resistivity of the film. Lower levels of oxygen in the target allow for resistivities of 1000 µΩ cm or less, down to 300 µΩ cm or even lower. FIG. 7 illustrates the density of the deposited film vs. nitrogen concentration. FIG. 8 illustrates the changing stress of the deposited film vs. the nitrogen concentration in the sputtering system.

Figure 9:
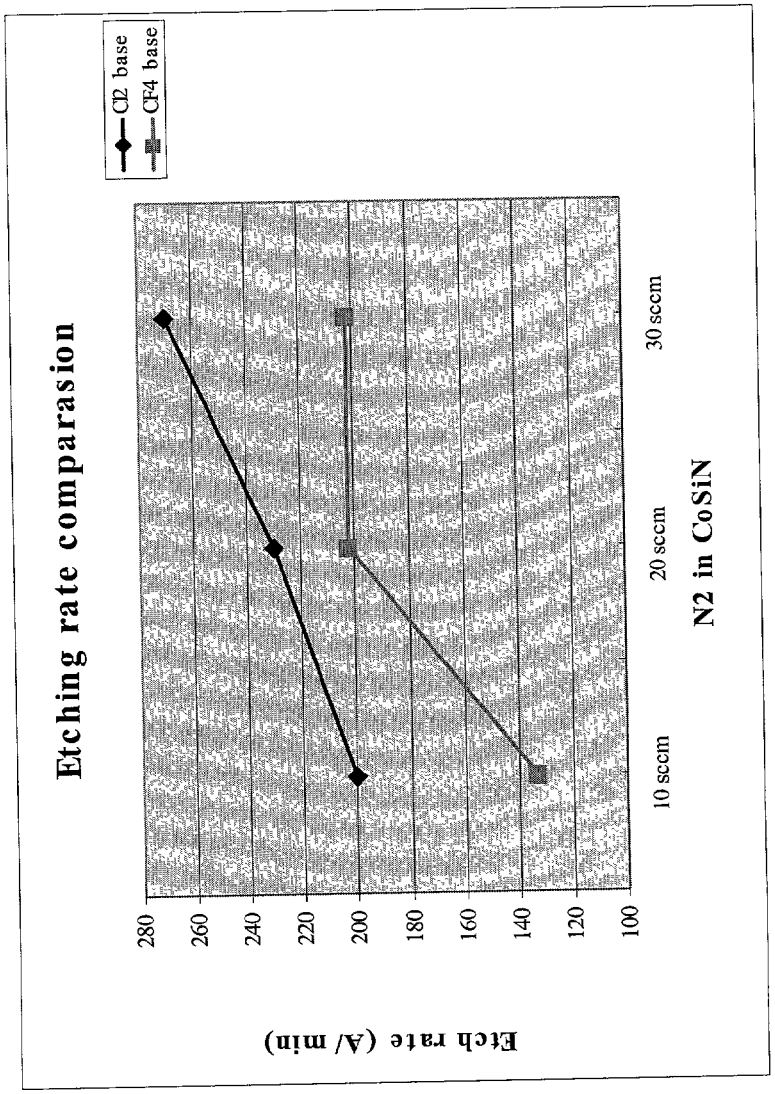
FIG. 9 is graph of etching rate for different etching chemistries.

The materials of the present invention can be etched with a suitable (preferably halogen) etchant. For example, known chlorine chemistry or fluorine chemistry etching methods could be used. If an etch chemistry of Cl2/BCl3/N2/CF4 (20/50/X/5 sccm) at 650 W power for 200 sec. is used, the amount etched is 200A, 230A, and 270A where X is 10, 20 and 30 sccm respectively. If an etch chemistry of CF4/CHF3/Ar/N2 (75/40/200/X sccm) at 200 W power for 480 sec. is used, the amount etched is 133A, 202A, and 202A where X is 10, 20 and 30 sccm respectively. This chlorine and fluorine chemistry etching is illustrated in FIG. 9. Of course, other process parameters or other known etching chemistries could be used, including suitable fluorocarbons and interhalogens set forth in U.S. patent application 60/293,092 to Patel et al., incorporated herein by reference.

The film need not be ternary, but could be a quarternary or higher film. This could be accomplished by incorporating into the sputtering target an additional transition metal, and/or more than one of Si, Al, B, C or P. However in the preferred embodiment, there is a single transition metal and only one or two of Si, Al, B or C. Some specific examples within the present invention include cobalt silicon nitride, platinum silicon nitride, nickel silicon nitride, iron aluminum nitride, cobalt silicon carbonitride, nickel aluminum boro-nitride, palladium silicon oxynitride, platinum aluminum boronitride, nickel boron nitride, cobalt boron nitride, gold aluminum nitride, and ruthenium silicon nitride. These are but a few examples that can be used for the MEMS structure (particularly the flexible portion of the MEMS device) as set forth herein. Other ternary examples are shown in FIGS. 4A to 4L.

Many variations from the above-described examples are possible. For example, in place of sputtering the films as described above, it is also possible to deposit some films by chemical vapor deposition (CVD) (e.g. plasma enhanced CVD or PECVD, or low pressure CVD or LPCVD). Also, though electrically conductive films are preferred in the present invention (e.g. for applying a potential to the movable element of the MEMS device, or simply for reducing charging in the device), electrically insulating films are also within the scope of the invention. Though the invention is directed to any MEMS device, specific mirrors and methods for projection displays or optical switching could be used with the present invention, such as those mirrors and methods set forth in U.S. Pat. No. 5,835,256 to Huibers issued Nov. 10, 1998; U.S. Pat. No. 6,046,840 to Huibers issued Apr. 4, 2000; U.S. patent applications Ser. No. 09/767,632 to True et al. filed Jan. 22, 2001; Ser. No. 09/564,069 to Richards filed May 3, 2000; Ser. No. 09/617,149 to Huibers et al. filed Jul. 17, 2000; Ser. No. 09/631,536 to Huibers et al. filed Aug. 3, 2000; Ser. No. 09/626,780 to Huibers filed Jul. 27, 2000; 60/293,092 to Patel et al. filed May 22, 2001; Ser. No. 09/637,479 to Huibers et al. filed Aug. 11, 2000; and 60/231,041 to Huibers filed Sep. 8, 2000. If the MEMS device is a mirror, the particular mirror shapes disclosed in U.S. patent application Ser. No. 09/732,445 to Ilkov et al. filed Dec. 7, 2000 could be used. Also, the MEMS device need not be a micromirror, but could instead be any MEMS device, including those disclosed in the above applications and in application 60/240,552 to Huibers filed Dec. 13, 2000. In addition, the sacrificial materials, and methods for removing them, could be those disclosed in U.S. patent application 60/298,529 to Reid et al. filed Jun. 15, 2001. Lastly, assembly and packaging of the MEMS device could be such as disclosed in U.S. patent application 60/276,222 filed Mar. 15, 2001. Each of these patents and applications is incorporated herein by reference.

Throughout the present application structures or layers are disclosed as being "on" (or deposited on), or over, above, adjacent, after, etc. other structures or layers. It should be recognized that this is meant to mean directly or indirectly on, over, above, adjacent, etc., as it will be recognized in the art that a variety of intermediate layers or structures could be interposed, including but not limited to sealant layers, adhesion promotion layers, electrically conductive layers, layers for reducing stiction, etc. In the same way, structures such as substrates or layers can be as a laminate due to additional structures or layers. Also, the recitation of "one or more" or "at least one" in one location should not in any way indicate that lack of use of such phraseology elsewhere indicates the absence of a potential plural arrangement. In addition, when the phrase "directly or indirectly" is used, it should in no way restrict, in places where this phrase is not used, the meaning elsewhere to either directly or indirectly. Also, "MEMS", "micromechanical" and "micro electromechanical" are used interchangeably herein and the structure may or may not have an electrical component. Lastly, unless the word "means" in a "means for" phrase is specifically set forth in the claims, it is not intended that any elements in the claims be interpreted in accordance with the specific rules relating to "means for" phraseology.

The invention has been described in terms of specific embodiments. Nevertheless, persons familiar with the field will appreciate that many variations exist in light of the embodiments described herein. For example, the ceramic compound or matrix could be a carbide (e.g. SiC, TaC, WC, TiC, BC, etc. with a late transition metal (e.g tungsten carbide with cobalt). Or the ceramic compound could be an oxide, preferably a ternary system with an element from groups 3A to 6A (of the periodic table) such as silicon or aluminum; oxygen; and a late transition metal, e.g. one of Ru, Rh, Os, or Ir. In these examples bonding can occur between both the silicon (or other group 3A to 6A element) and oxygen as well as between the late transition metal and oxygen. Or a ternary system with a late transition metal that does not readily bond to oxygen (platinum, palladium etc.); oxygen, and a third element selected preferably from the first two rows of groups 3A to 6A of the periodic table, other than oxygen. Or, the ceramic matrix could be a suitable nitride, carbide or oxide (e.g. Si3N4, Al2O3, SiC, etc.) with crystallites of an early transition metal compound (e.g. nanocrystals of TiN or TiC). However, in a preferred embodiment of the invention, as set forth hereinabove, the MEMS material comprises a nitride ceramic and a late transition metal.

I claim:

1. A micromechanical device, comprising:
a movable portion and a flexible portion, the flexible portion comprising a nitride compound and a late transition metal, wherein the nitride compound and late transition metal are in the same film or layer and wherein the film or layer is a ternary or higher system; wherein the nitride compound is a nitride of silicon, boron or aluminum.

2. The micromechanical device of claim 1, wherein the nitride compound is a silicon nitride or boron nitride.

3. The micromechanical device of claim 1, wherein the late transition metal is selected from the groups 8B or 1B of the periodic table.

4. The micromechanical device of claim 1, wherein the late transition metal is a ferromagnetic metal.

5. The micromechanical device of claim 1, which is a MEMS sensor or actuator.

6. The micromechanical device of claim 1, wherein the late transition metal is a noble metal.

7. The micromechanical device of claim 1, wherein the late transition metal is Co, Ni, Pd, Pt, Ag or Au.

8. The micromechanical device of claim 1, wherein the nitride comprises less than 0.1% oxygen.

9. The micromechanical device of claim 1, wherein the nitride is an oxynitride that comprises up to 10% oxygen.

10. The micromechanical device of claim 1, comprising a substrate, the movable element formed in or on the substrate and a hinge for allowing movement of the movable element relative to the substrate.

11. The micromechanical device of claim 10, wherein the substrate is a semiconductor or light transmissive substrate.

12. The micromechanical device of claim 10, wherein the movable element and/or the hinge are formed of the nitride compound and the late transition metal.

13. The micromechanical device of claim 12, further comprising posts or walls for connecting the movable element to the substrate via the hinge.

14. The micromechanical device of claim 10, wherein the hinge is a sputtered hinge.

15. The micromechanical device of claim 10, wherein the device is a micromirror device with said movable element having a reflective layer thereon or therein.

16. The micromechanical device of claim 15, wherein the reflective layer comprises Al, Ti or Au.

17. The micromechanical device of claim 15, wherein the micromirror device is a light beam steering device.

18. The micromechanical device of claim 17, wherein the light beam steering device is within an optical switch.

19. The micromechanical device of claim 15, wherein the micromirror device is part of a micromirror array in a display.

20. The micromechanical device of claim 19, wherein the display is a direct view or projection display.

21. The micromechanical device of claim 10, which is a sensor.

22. A micromechanical device; comprising:
a movable portion that is capable of movement due to a flexible portion that comprises a late transition metal and an element from groups 3A to 6A of the periodic table and with the flexible portion being formed by chemical or physical vapor deposition, wherein the late transition metal and the element from groups 3A to 6A of the periodic table are in the same film or layer and wherein the film or layer is a ternary or higher system; wherein the late transition metal is a noble metal and wherein the flexible portion further comprises more than one element from the first two rows of groups 3A to 6A; and wherein one of the two or more elements is nitrogen.

23. The micromechanical device of claim 22, wherein the noblemetal of the late transition metal is selected from groups 8B or 1B of the periodic table.

24. The micromechanical device of claim 22, wherein another of the two or more elements is aluminum, boron, silicon carbon or oxygen.

25. The micromechanical device of claim 24, wherein the noble metal of the late transition metal is a ferromagnetic metal.

26. A micromechanical device, comprising:
a flexible hinge comprising a nitride compound and a late transition metal, wherein the nitride compound and late transition metal are in the same film or layer and wherein the film or layer is a ternary or higher system deposited by chemical or physical vapor deposition, wherein the nitride compound is a nitride of silicon, boron or aluminum.

27. The micromechanical device of claim 26, wherein the flexible hinge is attached to a movable portion that is operable to be actuated by an electrostatic force derived from an electrostatic field established between the movable portion and an electrode.

28. A micromechanical device selected from a micromirror, a MEMS switch and a MEMS sensor, comprising:
a movable portion and a flexible hinge to which the movable portion is attached such that the movable portion is operable to move, wherein the flexible hinge comprise a ceramic compound and a late transition metal, wherein the ceramic compound and late transition metal are in the same film or layer and wherein the film or layer is a ternary or higher system deposited by chemical or physical vapor deposition; wherein the ceramic compound is a nitride compound that is a nitride of silicon, boron or aluminum.

29. The micromechanical device of claim 28, wherein the flexible hinge is attached to a movable portion that is operable to be actuated by an electrostatic force derived from an electrostatic field established between the movable portion and an electrode.

30. A micromechanical device, comprising:
a movable portion and a flexible hinge to which the movable portion is attached such that the movable portion is operable to move, and wherein the flexible hinge comprises a ceramic compound and a late transition metal, wherein the ceramic compound and late transition metal are a ternary or higher system within a common layer, wherein the ceramic compound is a nitride compound which is a nitride of silicon, boron or aluminum.

31. The micromechanical device of claim 30, wherein the flexible hinge is attached to the movable portion that is operable to be actuated by an electrostatic force derived from an electrostatic field established between the movable portion and an electrode.

32. A micromechanical device, comprising:
a flexible portion comprising a nitride compound having an element from groups 3A to 6A of the periodic table and a late transition metal, wherein the nitride compound and late transition metal are in the same film or layer and wherein the film or layer is a ternary or higher system deposited by chemical or physical vapor deposition, wherein the late transition metal is a noble metal.

33. The micromechanical device of claim 32, wherein the flexible portion is a flexible hinge that is operable to be actuated by an electrostatic force derived from an electrostatic field established between the movable portion and an electrode.

34. The micromechanical device of claim 32, wherein the nitride compound is silicon nitride.

35. A micromechanical device, comprising:
a movable portion and a flexible portion, the flexible portion comprising a nitride compound and a late transition metal, wherein the nitride compound and late transition metal are in the same film or layer and wherein the film or layer is a ternary or higher system; and wherein the late transition metal is noble metal.

* * * * *